(12) United States Patent
Jiang et al.

(10) Patent No.: US 7,875,840 B2
(45) Date of Patent: Jan. 25, 2011

(54) IMAGER DEVICE WITH ANTI-FUSE PIXELS AND RECESSED COLOR FILTER ARRAY

(75) Inventors: Jutao Jiang, Boise, ID (US); Chen Xu, Boise, ID (US)

(73) Assignee: Aptina Imaging Corporation, George Town (KY)

( * ) Notice: Subject to any disclaimer, the term of this patent is extended or adjusted under 35 U.S.C. 154(b) by 1105 days.

(21) Appl. No.: 11/600,206

(22) Filed: Nov. 16, 2006

(65) Prior Publication Data
US 2008/0117319 A1 May 22, 2008

(51) Int. Cl.
H01L 27/00 (2006.01)

(52) U.S. Cl. .............. 250/208.1; 250/226; 348/273; 348/275

(58) Field of Classification Search .......... 250/208.1, 250/226; 348/273, 290, 336, 342, 275
See application file for complete search history.

(56) References Cited

U.S. PATENT DOCUMENTS

| | | | |
|---|---|---|---|
| 5,315,177 A | 5/1994 | Zagar et al. | |
| 5,331,196 A | 7/1994 | Lowrey et al. | |
| 5,844,298 A | 12/1998 | Smith et al. | |
| 5,886,392 A | 3/1999 | Schuegraf | |
| RE36,952 E | 11/2000 | Zagar et al. | |
| 6,188,092 B1* | 2/2001 | Hatano et al. | 257/229 |
| 6,396,539 B1 | 5/2002 | Heller et al. | |
| 6,441,482 B1 | 8/2002 | Foster | |
| 6,526,366 B1 | 2/2003 | Dunton | |
| 6,529,239 B1 | 3/2003 | Dyck et al. | |
| 6,566,151 B2 | 5/2003 | Yeh et al. | |
| 6,587,142 B1* | 7/2003 | Kozlowski et al. | 348/241 |
| 7,052,941 B2* | 5/2006 | Lee | 438/152 |
| 7,173,851 B1 | 2/2007 | Callahan et al. | |
| 7,236,415 B2 | 6/2007 | Forbes et al. | |
| 7,365,298 B2 | 4/2008 | Ryu | |
| 7,369,167 B2 | 5/2008 | Bruce et al. | |
| 7,692,673 B2 | 4/2010 | Shin | |
| 2002/0075743 A1 | 6/2002 | Ooishi et al. | |
| 2002/0079504 A1 | 6/2002 | Kim | |
| 2002/0154229 A1* | 10/2002 | Takahashi et al. | 348/251 |
| 2003/0052976 A1* | 3/2003 | Harada et al. | 348/220.1 |
| 2004/0084700 A1 | 5/2004 | Kim | |
| 2004/0239789 A1 | 12/2004 | Bruce et al. | |
| 2005/0102576 A1 | 5/2005 | Perner et al. | |
| 2006/0007331 A1* | 1/2006 | Izumi et al. | 348/246 |
| 2006/0145055 A1 | 7/2006 | Kim | |
| 2006/0183265 A1* | 8/2006 | Oh et al. | 438/65 |
| 2007/0158772 A1 | 7/2007 | Boettiger | |
| 2008/0017945 A1 | 1/2008 | Wu et al. | |
| 2008/0054386 A1* | 3/2008 | Akram | 257/432 |
| 2008/0116537 A1 | 5/2008 | Adkisson et al. | |
| 2008/0122960 A1 | 5/2008 | Liu et al. | |
| 2008/0218608 A1* | 9/2008 | Rossi et al. | 348/243 |

* cited by examiner

Primary Examiner—Georgia Y Epps
Assistant Examiner—Kevin Wyatt

(57) ABSTRACT

An imager device having a recessed color filter array formed in a trench of a material layer above a pixel array. Light-sensitive pixels are formed in the center area of the array, while non-light-sensitive pixels are formed in a buffer region adjacent the light-sensitive pixels and beneath an area of the color filter array having a non-uniform thickness. The non-light-sensitive pixels may be anti-fuse pixels functioning as individual, programmable memory cells, thereby providing in-pixel memory for the imager device.

36 Claims, 7 Drawing Sheets

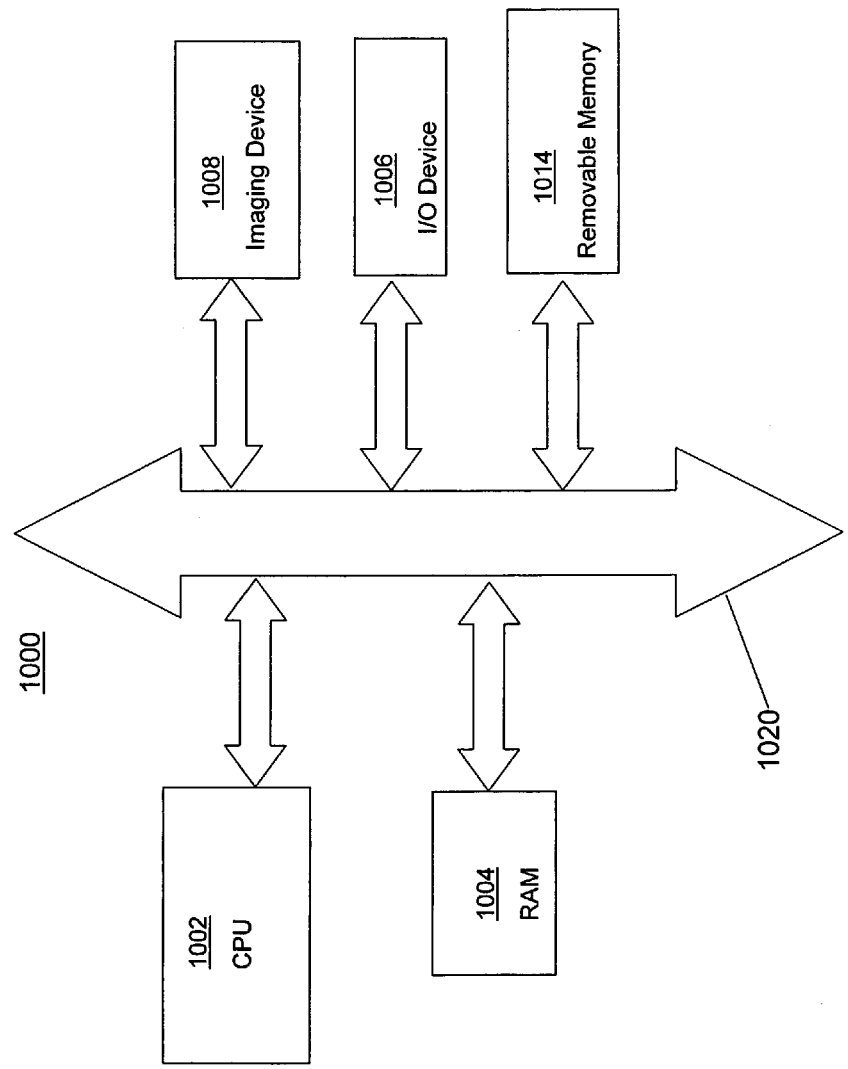

IMAGER DEVICE WITH ANTI-FUSE PIXELS AND RECESSED COLOR FILTER ARRAY

FIELD OF THE INVENTION

Embodiments of the invention relate generally to the field of solid state imager devices.

BACKGROUND OF THE INVENTION

There are a number of different types of semiconductor-based imager devices, including charge coupled devices (CCD's), photodiode arrays, charge injection devices (CID's), hybrid focal plane arrays, and complementary metal oxide semiconductor (CMOS) imagers. Current applications of solid-state imager devices include cameras, scanners, machine vision systems, vehicle navigation systems, video telephones, computer input devices, surveillance systems, auto focus systems, star trackers, motion detector systems, image stabilization systems, and other image acquisition and processing systems.

Solid state imager devices include an array of pixel cells, which converts light energy received, through an optical lens, into electrical signals. Each pixel cell contains a photosensor for converting a respective portion of a received image into an electrical signal. The electrical signals produced by the photosensors in the pixel cells are processed to render a digital image.

In a CMOS imager, the active elements of a pixel cell perform the necessary functions of: (1) photon to charge conversion; (2) accumulation of image charge; (3) transfer of charge to a floating diffusion region; (4) resetting the floating diffusion region to a known state; (5) selection of a pixel cell for readout; and (6) output and amplification of a signal representing the pixel cell charge. Photo-charge may be amplified when it moves from the initial charge accumulation region to the floating diffusion region. The charge at the floating diffusion region is typically converted to a pixel output voltage by a source follower output transistor.

To detect color, the spectral components of incident light must be separated and collected. An absorptive color filter array (CPA) on top of an imager device is currently the dominant technology for color detection in solid state imager devices. In a typical imager device layout, a micro-lens and color filter are stacked as part of a pixel stack.

For example, as shown in FIG. 1, color filters 15 are deposited on top of an array of pixel cells 22 formed on a semiconductor substrate 10. Each pixel cell 22 has a photosensor 12, which may be any photon-to-charge converting device, such as a photogate, photoconductor or photodiode. The color filters 15 are typically formed as an array over one or more optional metal light shield layer 18 in the imager device 20, and are further separated from the photosensor 12 by one or more interlevel dielectric (ILD) and metallization layers 16 and a passivation layer 14. Portions of the metallization layers 16 and the metal shields 18 may be opaque and used to shield the area of the pixel cells 22 that is not intended to be light-sensitive. Convex micro-lenses 21 are typically formed over the color filters 15. In operation, incident light is focused by the micro-lenses 21 through the filter array 15 to the appropriate light-sensitive photosensor 12.

In an effort to reduce the pixel stack height and to bring the micro-lenses 21 and color filters 15 closer to the photosensors 12, the entire color filter array can be lowered into a recessed area within the imager device 20. However, the use of a recessed color filter array has some problems. For example, if the recess depth exceeds the thickness of the color filter array film, the typical method of planarizing, i.e., chemical mechanical planarization (CMP), may no longer improve the planarity of the color filter array, leaving the color filters 15 with an uneven top surface. The surface unevenness can cause problems for an imager device. For example, the uneven surface does not create a solid foundation for a micro-lens array, which is typically constructed over the color filters. In addition, an uneven color filter array surface can cause imaging efficiency reduction by creating additional fixed pattern noise or a shading effect in certain areas of the imager device.

There is needed, therefore, an imager device providing a color filter array within a recessed area such that a lack of planarity in the surface of the color filter array does not degrade the imaging quality of the device.

BRIEF DESCRIPTION OF THE DRAWINGS

FIG. 6 shows a processor system, for example a camera system, incorporating at least one imager device constructed in accordance with an embodiment of the invention.

DETAILED DESCRIPTION OF THE INVENTION

In the following detailed description, reference is made to the accompanying drawings, which form a part hereof and show by way of illustration example embodiments in which the invention may be practiced. These embodiments are described in sufficient detail to enable those skilled in the art to practice them, and it is to be understood that other embodiments may be utilized, and that structural, logical, and electrical changes may be made.

The terms "wafer" and "substrate" are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide. The terms "pixel" and "pixel cell," as used herein, refers to a photo-element unit cell containing a photosensor device and associated structures for converting photons to an electrical signal.

In addition, although the embodiments are described with respect to a CMOS imager device, they are not so limited; the disclosed embodiments could be used with any solid state imager technology, including CCD and others. Accordingly, the following detailed description of example embodiments is not to be taken in a limiting sense.

Figure 1:
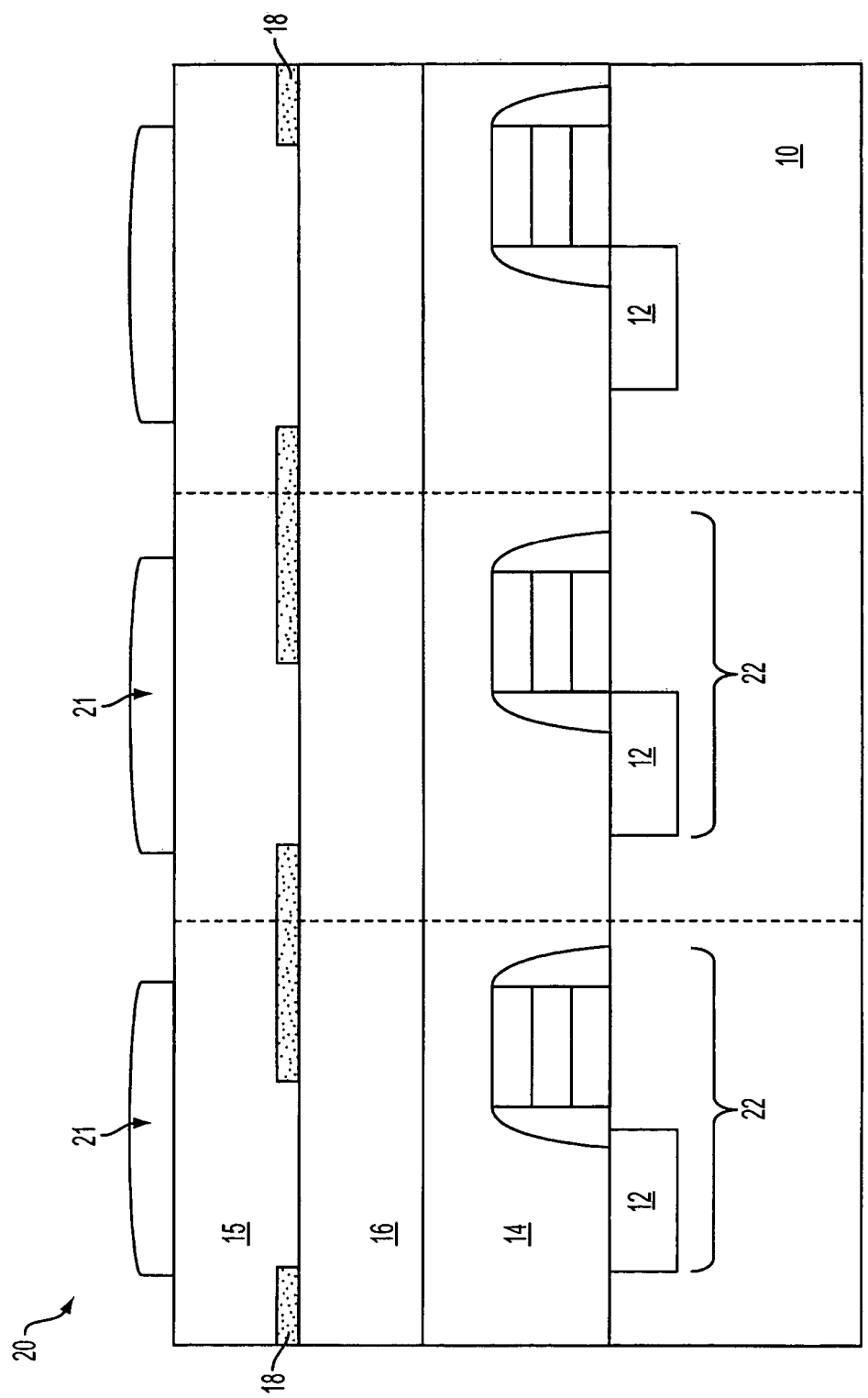
FIG. 1 is a cross-sectional view of a part of a conventional imager device.
Figure 2:
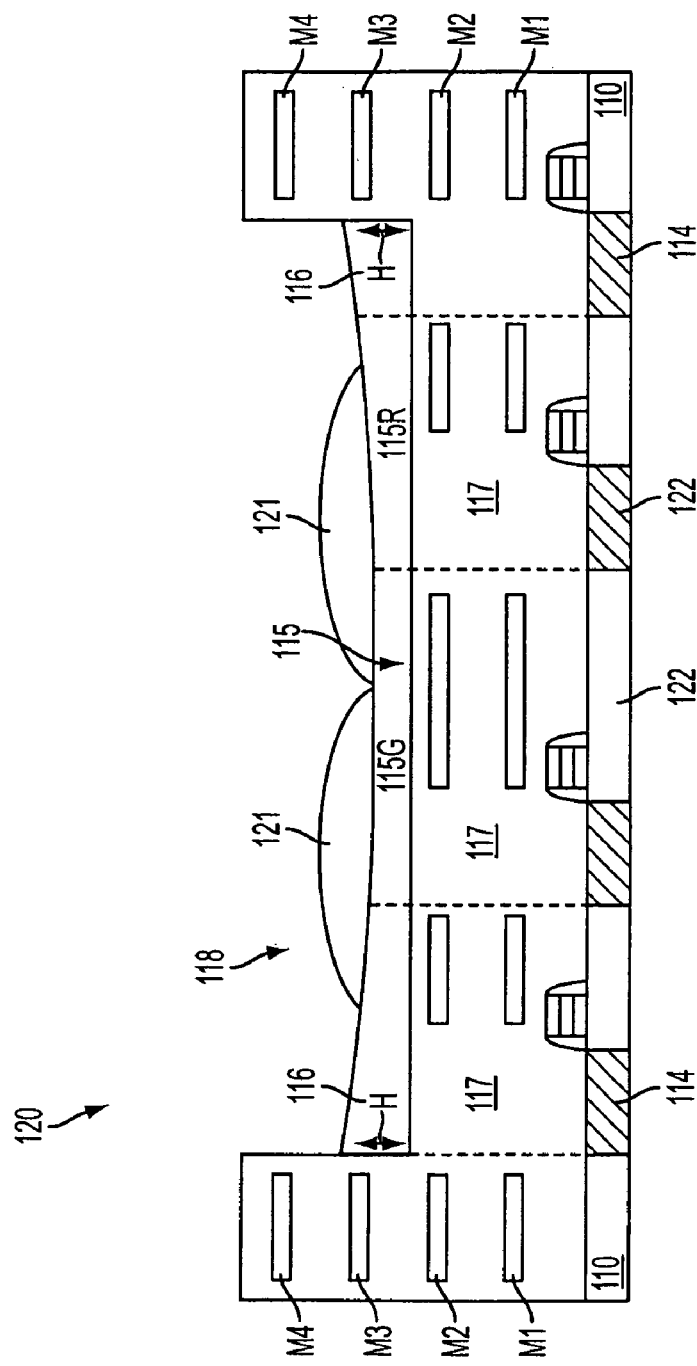
FIG. 2 depicts a cross-sectional view of a part of an imager device having a recessed color filter array formed in accordance with an embodiment of the invention.

Turning to the Figures, where like numerals represent like elements, the following embodiments are now described with reference to FIGS. 2-6. FIG. 2 illustrates a cross-sectional view of a portion of an imager array 120. The imager array 120 includes a recessed color filter array 115 having color filters 115R, 115G formed in a recessed area, i.e., trench 118, within the material layers in the array 120. Unlike the conventional imager 20 (FIG. 1) having a color filter array 15 formed over metallization and other layers 18, 16, the imager array 120 illustrated in FIG. 2, has a color filter array 115 formed in a trench 118 within two of the four metallization layers M1, M2, M3, M4. The metallization layers M1, M2, M3, M4 are formed over a semiconductor substrate 110 and are separated from each other by inter-layer dielectric layers 117. It should be understood that the imager array 120 may have more or fewer than four metallization layers M1, M2, M3, M4 and that the recessed color filter array 115 may be formed within any combination of material layers including, but not limited to, the metallization layers M1, M2, M3, M4 and dielectric layers 117, formed over the substrate 110.

The illustrated color filter array 115 has red 115R, green 115G, and blue color filters (not shown in this cross-section) that are formed in a Bayer color filter pattern of repeated rows of red and green and blue and green color filters. Other color filter patterns having different color filters (such as, e.g., cyan, magenta, and yellow) may also be used with the embodiments described herein. Micro-lenses 121 are formed over at least some of the color filters 115G, 115R of the color filter array 115. Accordingly, the micro-lenses/color filters serve to focus a particular wavelength range of light onto underlying pixels 122, as discussed in more detail below. Specifically, wavelengths of light in the range of about 650 nm to about 690 nm are focused beneath the red color filter 115R and wavelengths of light in the range of about 500 nm to about 520 nm will be focused beneath the green color filter 115G. Although the micro-lenses 121 and individual color filters 115R, 115G are shown as separate elements in FIG. 2, alternatively, the microlenses 121 could be formed of a color filter material thereby serving both functions of the separate elements.

One advantage of having the color filters 115R, 115G formed in a recessed area, i.e., trench 118, is that the distance from the top of the photo-sensitive regions in the pixels 122 to the bottom of the micro-lenses 121, also known as the pixel stack height, is reduced. A reduced stack height increases the aspect ratio of the array 120, which in turn, advantageously affects the pixel performance by improving quantum efficiency, increasing the ability of pixels to accept wide ranges of incident light and decreasing the cross-talk among pixels.

One drawback of the recessed color filter array 115, however, is that the thickness of the color filter array material that forms the individual color filters 115R, 115G is typically non-uniform across the array 115. This non-uniformity is particularly acute in the region close to the trench 118 sidewalls. As shown in FIG. 2, the thickness H of the color filter array material 116 in the region near the trench 118 sidewalls can be significantly greater than the thickness of the color filters 115R, 115G near the center of the color filter array 115. This difference in color filter thickness can be on the magnitude of approximately 200-1500 Angstroms or more. As described above, this lack of uniformity can cause problems in the imager device, including making the pixel output signals for underlying pixels non-uniform.

Having recognized this potential drawback, the embodiments described herein provide non-imaging pixels 114 formed in the area of the imager array 120 beneath the uneven edges of the color filter material 116. The operation of the non-imaging pixels 114 is not light-sensitive, and therefore, is not affected by the uneven color filter material 116.

Figure 3:
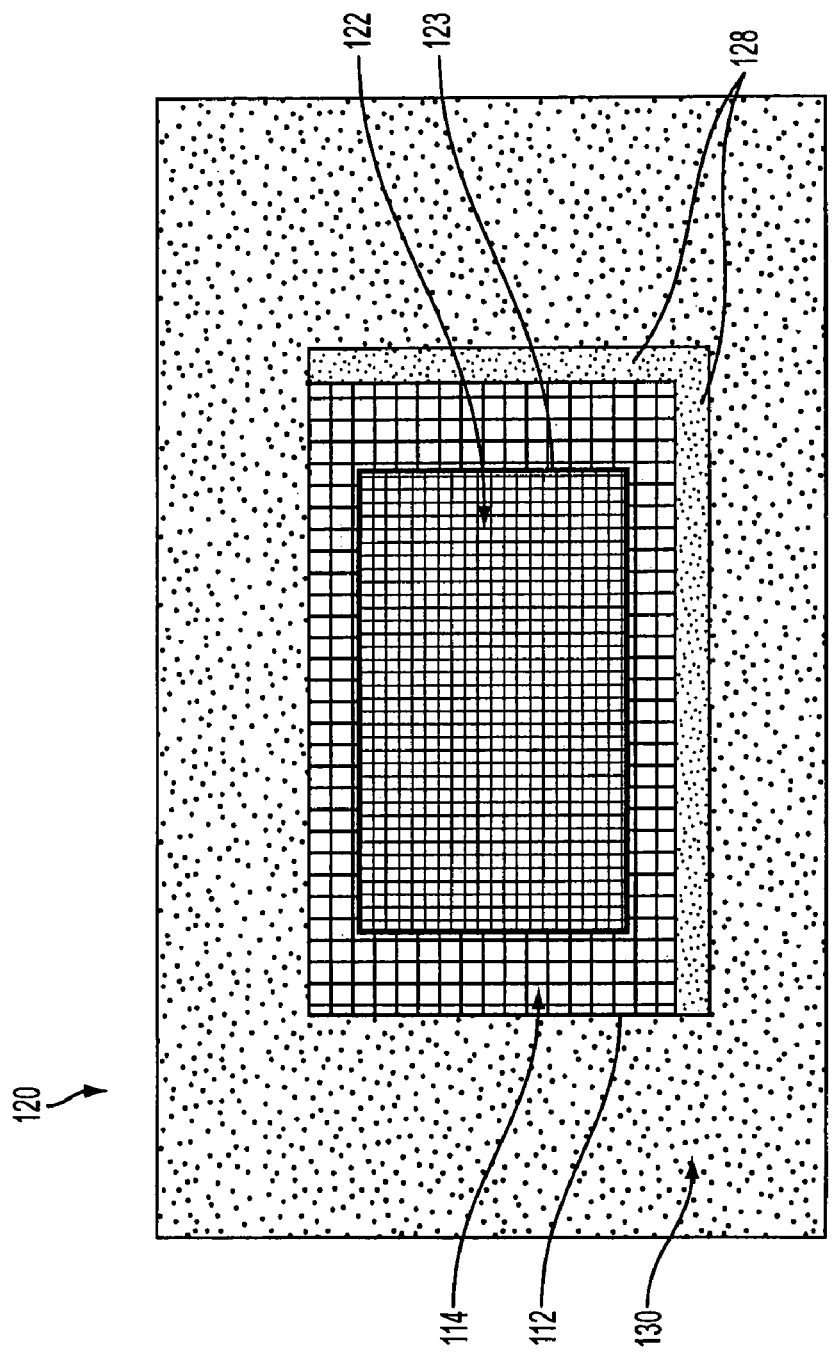
FIG. 3 depicts a top-down view of an imager array formed in accordance with an embodiment of the invention.

FIG. 3 illustrates a top down view of the imager array 120. In the center of the imager array 120 is an imaging pixel array 123 comprised of light-sensitive, imaging pixels 122. These imaging pixels 122 produce pixel output signals (such as pixel image signal Vsig and pixel reset signal Vrst) that are used to reproduce an image, as described in more detail below. These imaging pixels 122 are formed on the semiconductor substrate 110 under micro-lenses 121 that focus the light on the photosensitive portions of the imaging pixels 122, which may be photodiodes, photogates, or some other photoconversion devices.

Surrounding the light-sensitive, imaging pixel array 123 is a buffer region 112 having non-imaging pixels 114. Dark row/column pixels 128 can be formed on one or more sides of the buffer region 112. Periphery circuitry 130 is formed on the outer edges of the imager array 120.

The non-imaging pixels 114 of the buffer region 112 may be formed, as shown, to surround the imaging pixel array 123, or alternatively, on any one or more sides of the imaging pixel array 123. In addition, the buffer region 112 may include any number of lines (which may be rows or columns) of non-imaging pixels 114. The buffer region 112, thus, may be as small as the width of only one pixel or may be as wide as 60 microns or more, depending on the pixel pitch. The buffer region 112 may be formed completely beneath the non-uniform edge of the color filter material 116 at the trench 118 sidewalls in layers above. Thus, micro-lenses 121 do not need to be formed over the buffer region 112.

In fact, the non-imaging pixels 114 are not intended for imaging purposes. In accordance with one embodiment, the non-imaging pixels 114 can instead used for storing information. Specifically, the non-imaging pixels 114 may be used to store image sensor or other module information. As one example, the non-imaging pixels 114 could be used to store information on image processing pipeline parameters such as, e.g., lens shading correction coefficients or default register settings for the imaging pixels 122. This buffer region 112, however, is in no way limited to the type of information that can be stored by the non-imaging pixels 114.

Providing in-array information storage in the buffer region 112 also frees up other areas of the array 120, such as the metallization layers M1, M2, M3, M4, that typically contain this information in the form of fuses or anti-fuses. Advantageously, this in-array storage allows either more information to be stored in the array 120, as these metallization layers M1, M2, M3, M4 can store other information, or space to be saved, as one or more of the metallization layers M1, M2, M3, M4 may not be needed at all.

Figure 4:
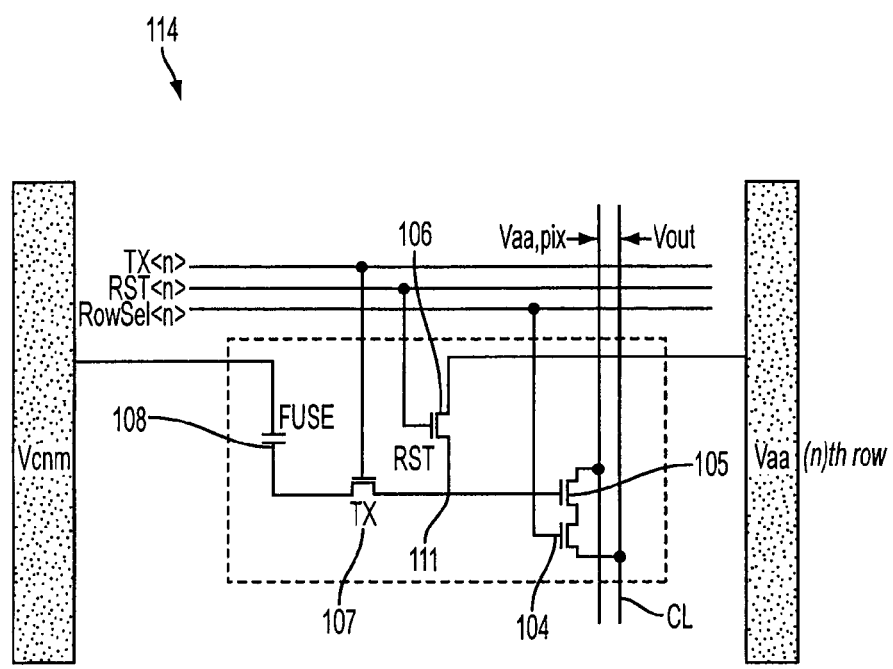
FIG. 4 depicts an anti-fuse pixel in electrical schematic form constructed in accordance with an embodiment of the invention.
Figure 4A:
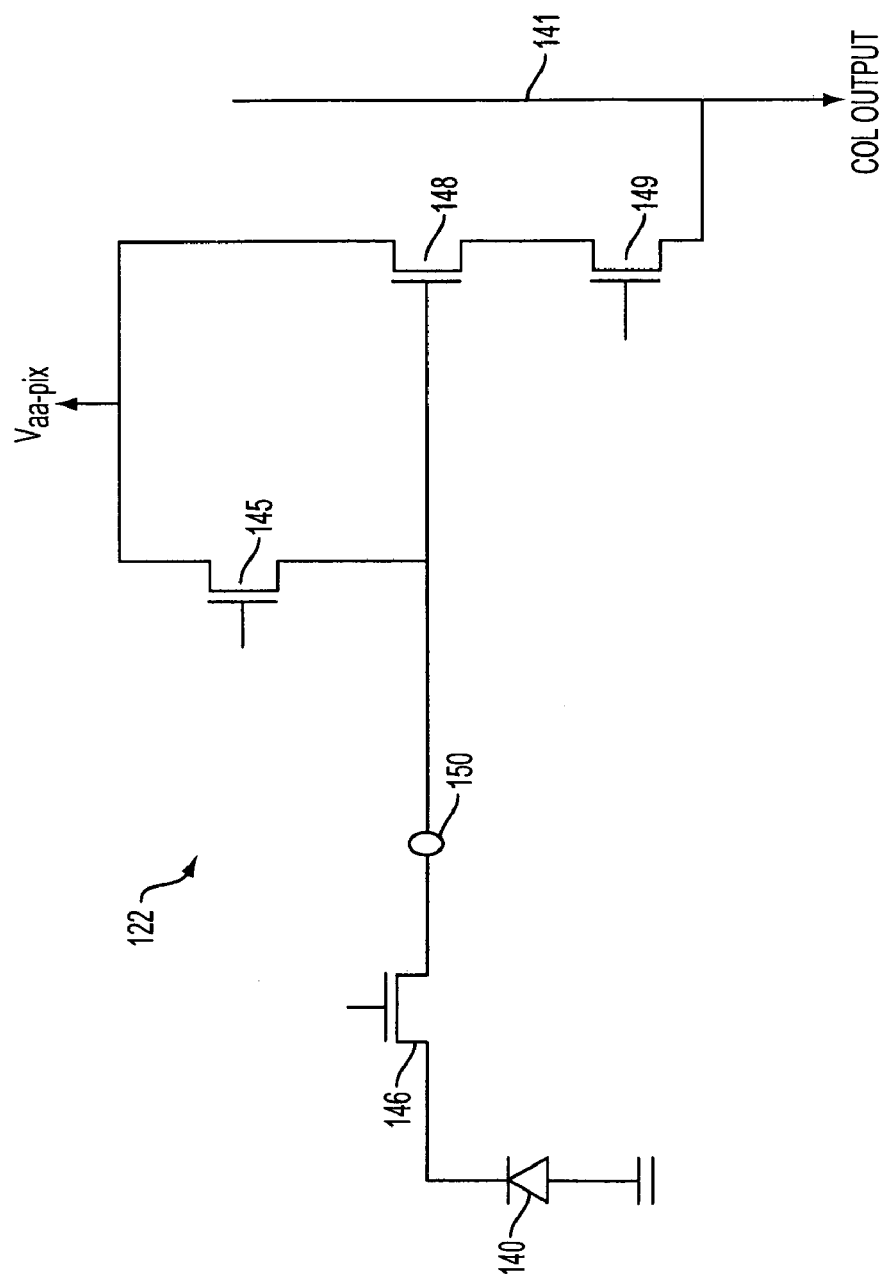
FIG. 4A depicts an imaging pixel in electrical schematic form that can be used in the imager array shown in FIG. 3.

FIG. 4 shows in electrical schematic form a non-imaging pixel 114 that may be used in the buffer area 112 (FIG. 3) while FIG. 4A shows in electrical schematic form an imaging pixel 122 that may be used in the imaging array 123 of the imager device array 120 (FIG. 3). The non-imaging pixel 114 may be constructed and operated as described in U.S. application Ser. No. 11/600,203, assigned to Micron Technology Inc., and incorporated herein by reference.

The structure and operation of imaging pixel cell 122 is now described. The imaging pixel 122 has a photosensor illustrated as a photodiode 140. When incident light hits the photodiode 140, electron/hole pairs are generated in the p-n junction of the photodiode 140. The generated electrons (photo-charges) are collected in an accumulation region of the photodiode 140. The photo-charges move from the initial charge accumulation region to a floating diffusion region 150 via a transfer transistor 146. The charge at the floating diffusion region 150 is typically converted to a pixel output voltage by a source follower transistor 148 and subsequently output as a pixel signal on a column output line 141 via a row select transistor 149. In addition, the imaging pixel 122 has a transistor 145 for resetting the floating diffusion region to a predetermined charge level ($V_{AA\text{-}pix}$) prior to charge transference; the reset transistor 145 is also used for resetting the charge level at the photodiode 140. It should be understood, however, that although imaging pixel 122 is shown in FIG. 4A and described herein as a pixel cell having a photodiode and a four-transistor layout, that the imaging pixels 122 may have any number of other pixel designs, including other types of photosensors and having more or fewer than four transistors.

The illustrated non-imaging pixel 114 may be referred to as an anti-fuse pixel because it contains an anti-fuse 108 having one of a blown state and an un-blown state that are respectively used to indicate first and second stored data values as described below. The non-imaging pixel 114 can be fabricated in a semiconductor substrate 110 having the same pixel pitch as normal active pixels, such as imaging pixels 122 (FIG. 3). In fact to increase the simplicity of fabrication and operation, the non-imaging pixels 114 can share reset RST, transfer TX, and row select RowSel control signals with the associated imaging pixel array 123.

The anti-fuse, non-imaging pixel 114 shown in FIG. 4 includes anti-fuse 108 connected between a control voltage source Vcmn and a source terminal of a transfer transistor 107. As described below, Vcmn can have a programming voltage applied to it during programming and another voltage during normal operation modes. The transfer transistor 107 is controlled by a transfer control signal TX applied at its gate terminal. A drain for the transfer transistor 107 may be a storage region 111 that is also electrically connected to a reset transistor 106. The reset transistor 106 is controlled by the reset signal RST to reset the potential of the storage region 111 to the reset voltage level Vaa. The storage region 111 is also connected to a gate of a source follower transistor 105, which has a drain connected to a source of a row select transistor 104, through which charges stored in the storage region 111 can be read out as a voltage Vout onto a column line CL in response to the row select signal RowSel.

In a programming operation, in accordance with one embodiment, the anti-fuse 108 of the non-imaging pixel 114 is blown by applying appropriate "programming" voltage as the control voltage. Specifically, to blow the anti-fuse 108, a high voltage—which may be on the order of about 5V or more—is applied to the anti-fuse 108. It should be appreciated that how the anti-fuse 108 is blown, however, is immaterial.

Whether the anti-fuse 108 is blown or not, during normal operation, its value may be read out through the non-imaging pixel's 114 read out and amplification transistors (i.e., transfer 107, source follower 105, and row select 104 transistors). In the illustrated embodiment, a signal is read out from the non-imaging pixel 114 with a blown anti-fuse 108 as a HIGH signal. In contrast, if the anti-fuse 108 is not blown, a LOW signal is read out from the non-imaging pixel 114. The HIGH and LOW signals can be associated with certain respective values. For example, the HIGH signal can be assigned as a bit "1," and the LOW signal can be assigned as bit "0." As such, the non-imaging pixel 114 functions as a one-time programmable memory cell.

The HIGH and LOW signals read out from the non-imaging pixel 114 are not sensitive or dependent on incident light. The anti-fuse currents are several magnitudes larger than the photocurrent that would be stored on a floating diffusion region, for example, in an imaging pixel 122. The anti-fuse current may be approximately 300 nA or more, whereas the typical photocurrent generated by an imaging pixel 122 is in the range of about 10 fA to about 100 pA.

Thus, in accordance with the illustrated embodiments discussed above, non-imaging pixels 114 are used to store information in a buffer region 112 of an imager array 120. The buffer region 112 can be the area beneath a recessed color filter array 115 where the color filter array material 116 is uneven. As such, a variation in the non-uniform color filter array 115 thickness will not affect the operation of the underlying pixels 114, as they are not light sensitive and the information stored the non-imaging pixels 114 can be read out without error.

Figure 5:
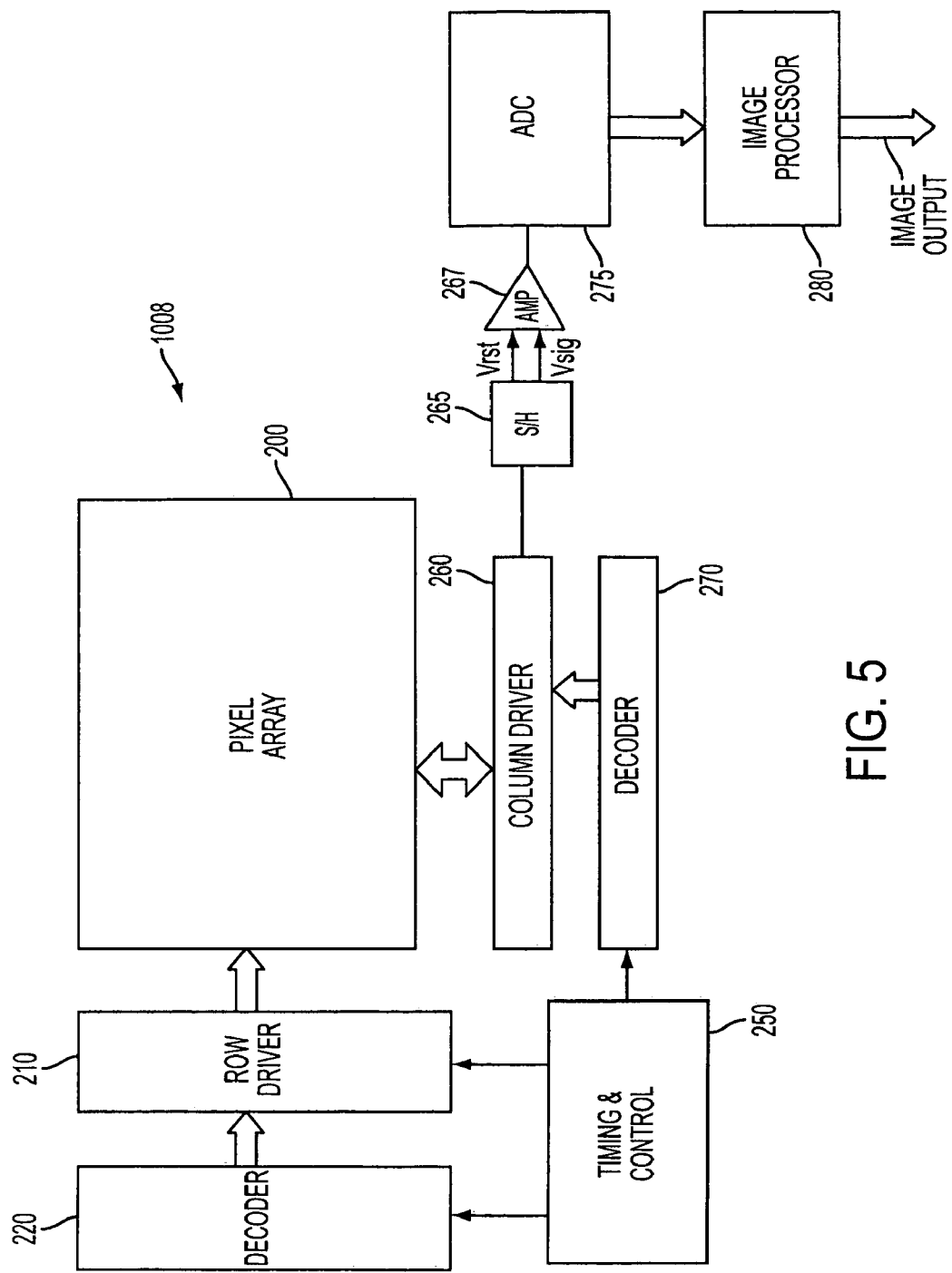
FIG. 5 shows a block diagram of an imager device constructed in accordance with an embodiment of the invention.

FIG. 5 illustrates a block diagram of a CMOS imager device 1008 having a pixel array 200 that can be constructed like the exemplary imager array 120 described above. Pixel array 200 comprises a plurality of pixels arranged in a predetermined number of columns and rows (not shown). The pixels of each row in array 200 are all turned on at the same time by a row select line, and the pixels of each column are activated by respective column select lines to output signals onto column lines. A plurality of row select, column select, and column lines are provided for the entire array 200. The row lines are selectively activated in sequence by a row driver 210 in response to row address decoder 220. The column select lines are selectively activated in sequence for each row activation by a column driver 260 in response to column address decoder 270. Thus, a row and column address is provided for each pixel.

The CMOS imager device 1008 is operated by a control circuit 250, which controls address decoders 220, 270 for selecting the appropriate row and column lines for pixel readout. Control circuit 250 also controls the row and column driver circuitry 210, 260 so that they apply driving voltages to the drive transistors of the selected row and column lines.

The pixel output signals typically include a pixel reset signal Vrst taken off of a floating diffusion region when it is reset by the reset transistor and a pixel image signal Vsig, which is taken off the floating diffusion region after photo-generated charges are transferred to it. The Vrst and Vsig signals are read by a sample and hold circuit 265 and are subtracted by a differential amplifier 267, to produce a differential signal Vrst-Vsig for each pixel. Vrst-Vsig represents the amount of light impinging on the pixels. This difference signal is digitized by an analog-to-digital converter 275. The digitized pixel signals are fed to an image processor 280 to form a digital image output. The digitizing and image processing can be located on or off the imager chip. In some arrangements the differential signal Vrst-Vsig can be amplified as a differential signal and directly digitized by a differential analog to digital converter.

FIG. 6 shows a processor system 1000, which includes an imager device 1008 (FIG. 5) described above. The processor system 1000 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, an image stabilization system.

System 1000, for example a still or video camera system, generally comprises a central processing unit (CPU) 1002, such as a microprocessor for controlling camera operations, which communicates with one or more input/output (I/O) devices 1006 over a bus 1020. Imaging device 1008 also communicates with the CPU 1002 over the bus 1020. The system 1000 also includes random access memory (RAM)

1004, and can include removable memory 1014, such as flash memory, which also communicates with the CPU 1002 over the bus 1020. The imager device 1008 may be combined with a processor, such as a CPU, digital signal processor, or microprocessor, with or without memory storage on a single integrated circuit or on a different chip than the processor.

While the embodiments have been described in detail in connection with embodiments known at the time, it should be readily understood that the invention is not limited to such disclosed embodiments. Rather, the embodiments can be modified to incorporate any number of variations, alterations, substitutions or equivalent arrangements not heretofore described. For example, although the non-imaging pixels 114 have been described as containing an anti-fuse 108, they can be modified to include any suitable programmable element that is not sensitive to incident light.

What is claimed as new and desired to be protected by Letters Patent of the United States is:

1. An imager device comprising:
   an array of pixels formed on a substrate, wherein the array comprises:
   a plurality of imaging pixels formed within the substrate;
   a plurality of non-imaging pixels formed within the substrate;
   a plurality of material layers formed over the substrate; and
   a recessed color filter array formed in a recess, the recess being formed as a trench in at least one of the plurality of material layers,
   wherein the plurality of non-imaging pixels are located at an area underneath uneven edges of the recessed color filter array.

2. The imager device of claim 1, wherein each of the plurality of non-imaging pixels is an anti-fuse pixel.

3. The imager device of claim 2, wherein the anti-fuse pixel is formed beneath a portion of the recessed color filter array.

4. The imager device of claim 3, wherein the portion of the color filter array formed over the anti-fuse pixel has a greater thickness than the color filters formed over the image sensing pixels.

5. The imager device of claim 1, wherein the array comprises image sensing pixels surrounded on at least one side by at least one line of data storage pixels.

6. The imager device of claim 5, wherein the image sensing pixels are surrounded on each side by at least one line of data storage pixels.

7. The imager device of claim 5, further comprising at least one line of dark pixels formed in the substrate on a side of the line of data storage pixels opposite that of the image sensing pixels.

8. The imager device of claim 1, wherein the plurality of material layers comprises at least two metal layers, and the recess is formed in at least one of the metal layers.

9. The imager device of claim 1, wherein each of the plurality of non-imaging pixels comprises an anti-fuse pixel, a transfer transistor connected to the anti-fuse pixel, and at least one transistor for reading out an anti-fuse pixel signal from the pixel based on a state of the anti-fuse pixel.

10. The imager device of claim 9, wherein the transfer transistor and transistor for reading out the anti-fuse signal share transistor control signals with transistors in the imaging pixels of the array.

11. The imager device of claim 1, wherein each of the plurality of non-imaging pixels forms a memory element.

12. The imager device of claim 11, wherein the memory element stores information relating to micro-lens shading coefficients for the device.

13. The imager device of claim 11, wherein the memory element stores information relating to color correction factors for the device.

14. A pixel array comprising:
   a first pixel array area formed on a semiconductor substrate, the first pixel array area comprising a plurality of imaging pixels for generating pixel signals in response to light;
   a second pixel array area formed on the substrate, the second pixel array comprising non-imaging pixels functioning as programmable memory cells;
   a color filter array formed over the first and second pixel areas; and
   a micro-lens array formed over the color filter array in an area over the first pixel array area,
   wherein the second pixel array area is located at an area underneath uneven edges of the color filter array.

15. The pixel array of claim 14, wherein the color filter array is formed in a recessed area surrounded by at least one material layer formed over the first and second pixel array areas.

16. The pixel array of claim 15, wherein the at least one material layer comprises a metallization layer.

17. The pixel array of claim 14, wherein each of the non-imaging pixels in the second pixel area comprises a programmable data storage element and a readout circuit.

18. The pixel array of claim 17, wherein the programmable data storage element contains information comprising lens shading coefficients.

19. The pixel array of claim 18, wherein the programmable data storage element additionally contains information comprising processing pipeline color correction factors for the array.

20. A processor system comprising:
   a processor; and
   an imager device coupled to the processor, the imager device comprising:
      an imaging pixel array comprising a first plurality of pixels for producing first signals, wherein the first signals are representative of an amount of light received at the first pixels;
      a buffer region comprising a second plurality of pixels for producing second signals, wherein the second signals are not representative of an amount of light received at the second pixels; and
      a color filter array formed in a recessed area in a material layer formed over the pixel array and buffer region,
      wherein the second plurality of pixels are located at an area underneath uneven edges of the color filter array.

21. The system of claim 20, wherein the system comprises a camera.

22. The system of claim 21, wherein the system comprises a still camera.

23. The system of claim 21, wherein the system comprises a video camera.

24. The system of claim 20, wherein the second plurality of pixels comprises anti-fuse pixels that are used to store information.

25. The system of claim 24, wherein the second signals represent logic states.

26. A method of forming an imager array comprising:
   forming a plurality of light-sensitive pixels on a semiconductor substrate;
   forming a plurality of non-light sensitive pixels each comprising a programmable element in the semiconductor substrate; and forming a recessed color filter material surrounded by at least one material layer above the light-sensitive and non-light sensitive pixels, wherein the formed plurality of non-light sensitive pixels are formed in a location that is underneath uneven edges of the recessed color filter material.

27. The method of claim 26, wherein the non-light sensitive pixels are formed in a buffer region that surrounds the light-sensitive pixels.

28. The method of claim 27, further comprising forming a plurality of micro-lenses over the light-sensitive pixels.

29. The method of claim 26, wherein forming a recessed color filter material comprises forming micro-lenses in a region above the light-sensitive pixels.

30. The method of claim 26, wherein the act of forming a plurality of non-light sensitive pixels comprises:

forming an anti-fuse in each pixel;

forming a controller to apply a programming voltage to the anti-fuse; and forming a readout circuit to read out a signal from the fuse.

31. The method of claim 30, further comprising applying a programming voltage to the anti-fuse in at least some of the non-light sensitive pixels.

32. A method of operating an imager device comprising:

utilizing a recessed color filter array to focus incident light having particular optical characteristics onto a first area of an imager array formed on a substrate beneath the color filter array, the first area comprising a plurality of imaging pixels;

obtaining a first set of signals from the array of imaging pixels, the first set of signals being representative of the incident light; and obtaining a second set of signals from a plurality of non-imaging pixels formed in a second area of the imager array which are formed beneath areas of the color filter array where there are uneven edges, wherein the second set of signals represent respective logic states for the non-imaging pixels.

33. The method of claim 32, wherein the second set of signals is not representative of the incident light.

34. The method of claim 32, wherein obtaining the first and second signals comprises operating timing and control circuitry that is shared by the imaging and non-imaging plurality of pixels.

35. The method of claim 32, wherein each of the second signals comprises a HIGH or LOW signal.

36. The method of claim 35, further comprising assigning a value of a bit "1" to each HIGH signal and a value of "0" to each LOW signal.

* * * * *